United States Patent [19]

Durivage, III et al.

[11] Patent Number: 5,166,862
[45] Date of Patent: Nov. 24, 1992

[54] PANEL FOR MOUNTING ELECTRONICS

[75] Inventors: Leon W. Durivage, III, Marion; Ronald J. Etscheidt, Anamosa, both of Iowa

[73] Assignee: Square D Company, Palatine, Ill.

[21] Appl. No.: 590,632

[22] Filed: Sep. 28, 1990

[51] Int. Cl.⁵ .............................................. H05K 7/20
[52] U.S. Cl. .................................... 361/383; 361/386; 361/388; 361/379
[58] Field of Search ............... 361/331, 332, 346, 347, 361/358, 359, 379, 381, 383, 384, 386, 388, 389, 392, 394, 395, 399; 335/6, 18, 202

[56] References Cited

U.S. PATENT DOCUMENTS

| | | | |
|---|---|---|---|
| 3,213,232 | 10/1965 | Gryctko | 361/379 |
| 3,297,916 | 1/1967 | Wright | 361/388 |
| 3,299,946 | 1/1967 | Recklinghausen | 361/383 |
| 4,029,999 | 6/1977 | Neumann et al. | 361/386 |
| 4,295,180 | 10/1981 | Herron et al. | 361/383 |
| 4,513,812 | 4/1985 | Papst et al. | 361/384 |
| 4,701,828 | 10/1987 | Weiner | 361/383 |
| 4,728,914 | 3/1988 | Morris et al. | 361/383 |
| 4,754,247 | 6/1988 | Raymont et al. | 335/202 |
| 4,868,362 | 9/1989 | Takeuji | 361/384 |
| 4,884,048 | 11/1989 | Castonguay et al. | 335/202 |
| 4,884,331 | 12/1989 | Hinshaw | 361/383 |
| 5,027,091 | 6/1991 | Lesslie et al. | 335/202 |

Primary Examiner—Gregory D. Thompson
Attorney, Agent, or Firm—Kareem M. Irfan

[57] ABSTRACT

There is provided a panel for mounting electronic components to circuit breakers. The panel includes formations for cooling electronic components, a method for sealing the electronic adjustment switches against tampering, and a method for preventing invalid electronic adjustments to the trip unit.

25 Claims, 5 Drawing Sheets

PANEL FOR MOUNTING ELECTRONICS

BACKGROUND OF THE INVENTION

The present invention generally relates to a panel for mounting electronic circuit boards and in particular to a panel for mounting electronic circuit boards onto circuit breakers.

As the control circuits utilized within circuit breakers grow in functionality and complexity, the power requirements for the electronics grows and, as a direct consequence, the heat dissipated by the electronics increases. This has made it necessary to provide cooling schemes for the electronics rather than to allow the temperature of the electronic devices to drastically increase, thus preventing early failure of the electronic components.

Previous designs utilized power dissipating devices that were attached to custom blocks of metal, called heat pipes, which in turn were attached to sheet metal panels. The sheet metal panels were generally covered by labels. Heat generated by the power dissipating devices was coupled to the heat pipes through a first thermal junction; the heat was conducted through the heat pipe and then coupled to the sheet metal panel through a second thermal junction. The heat was then conducted through the sheet metal panel, coupled through a third thermal junction to the label material and finally radiated to the air by the label material. These designs were adequate for the level of sophistication and subsequent heat dissipation of the electronics previously required. However, new designs containing more functions require higher computing power microcontrollers and thusly greater efficient cooling schemes are needed to compensate for the higher heat dissipation.

Another problem in providing rigid mounting for electronics is ensuring proper alignment of all mechanical elements of the underlying printed circuit board and the provision of resistance against damage to the board due to vibration. In the past a variety of methods were utilized, all primarily using a collection of mechanical mounting components, i.e. screws, spacers, standoffs, alignment posts, etc. This method of installation was generally very labor and material intensive and alignment of components was not achieved easily.

The electronics within circuit breakers generally contain switches to provide adjustment means. There are usually positions available on those switches that are not intended to be user selectable. It is therefore a requirement to provide a means to physically prohibit these switches from being set into these positions. In the past, either the switch itself was required to contain a stopping mechanism within it or an external stop plate was required to perform this requirement. The switches with the built in stop mechanism are generally more expensive to purchase and installation of the stop plate reduced manufacturing efficiency.

There is also a requirement in the circuit breaker industry to be able to seal the adjustments for the electronic controls from accidental or improper changes. This prevents the operational characteristics of the circuit breaker from being adjusted without the knowledge of that adjustment being evident by the breaking of the seal. In previous generations of electronic circuit breakers, this sealing requirement was met with several custom machine screw parts affixed to the face of the electronic adjustments mounting surface and lead seal wires were threaded through a special path to ensure tampering was clearly visible. These custom parts were expensive to purchase and install.

In order to set the operational characteristics of the circuit breaker, the user must refer to labels installed adjacent to the adjustment switches to determine setting information. Because of the wide range of product lines and subcategories within product lines, there is usually a large number of switches and combinations of labels required. The installation of labels on switches involves two important operations, choosing the proper label combination for the specific product being built and ensuring proper positioning of the label adjacent to the switch. Previous electronic circuit breakers either had separate labels for each type of circuit breaker, thus creating a large inventory of labels or used separate smaller labels pieced together to form the entire electronics label. This latter approach was more inventory efficient but presented a manufacturing problem in ensuring proper alignment of the label to the switch.

SUMMARY OF THE INVENTION

While each of the above mentioned problems could be solved by individual components, a single component was designed with numerous specific design features that allow for a simultaneous solution to all of the aforementioned problems.

A panel is provided that facilitates cooling of the electronic components by incorporating several important features. The first feature is a surface for directly mounting a power transistor and providing cooling from the top surface of the transistor package. The second feature is the design of a large thermal mass of material in direct contact with the transistor to help protect the transistor during high power surges. The third feature is the design of heat dissipation ribs directly above the transistor to maintain a safe operating temperature during moderate to high power surges. The forth feature is a general design feature that allows for maximum surface area that has direct exposure with the ambient air. This includes limiting the switch label surface area and including extra heat dissipation ribs where possible. The fifth feature is the use of a textured black paint as a surface coating which has much better heat dissipation than the natural material finish or black chromated finishes.

This invention provides for printed circuit boards to be mounted directly to standoffs that are formed integrally with the panel. A clear plastic part is securedly sealed to the panel to prevent tampering with the electronic adjustments. The under surface of the panel has two sets of concentric stop rings with elevated and sunken surfaces on the rings that cooperate with the knobs that are installed on the switches for assuring valid switch setting. The top surface of the panel, adjacent to each adjustment area, is indented to allow a small label to be positively aligned onto the panel. An access opening has been designed into the panel that allows for easy initial insertion of a standard 1000 micron plastic fiber optic cable, but has a gradual taper that will cause an interference fit and retain the cable.

In accordance with one aspect of this invention, there is provided a device for mounting electronic components that comprises a panel having means therein for mounting electronic components thereon, the panel further having means therein for cooling the electronic components.

In accordance with another aspect of this invention, there is provided a panel for mounting a circuit interrupter electronic trip unit comprising means for cooling electronic components having heat dissipation ribs integrally formed to the panel, electronic adjustment tamper resistant sealing means, and stop means for preventing invalid electronic In accordance with yet another aspect of this invention, there is provided a circuit interrupter comprising separable contacts, an operating mechanism for opening and closing the separable contacts, an electronic trip unit for the control of the operating mechanism to initiate opening of the separable contacts upon occurrence of an overcurrent condition, and a panel for mounting the electronic trip unit to the circuit interrupter.

It is an object of this invention to provide a panel for cooling electronic components and efficiently mounting circuit boards.

It is another object of this invention to provide a means to seal electronic adjustments to prevent tampering.

It is another object of this invention to provide a means to prevent switches from being set in invalid positions.

It is another object of this invention to provide efficient mounting surfaces for labels.

It is another object of this invention to provide efficient access to a fiber optic communications port.

Other objects and advantages will appear when the following description is considered along with the accompanying drawings.

DETAILED DESCRIPTION OF THE PREFERRED EMBODIMENTS

For a better understanding of the present invention together with other and further advantages, and capabilities thereof, reference is made to the following disclosure and appended claims in connection with the above-described drawings.

In general the present invention provides a panel for cooling electronic components as well as providing a means for mounting electronic printed circuit boards to a circuit breaker. The present invention also teaches a means for preventing tampering with the electronic adjustment switches and means for preventing the aforementioned switches from being set to invalid positions. An efficient mounting surface for labels and an efficient access to fiber optic communications ports are also taught by the present invention.

Figure 1:
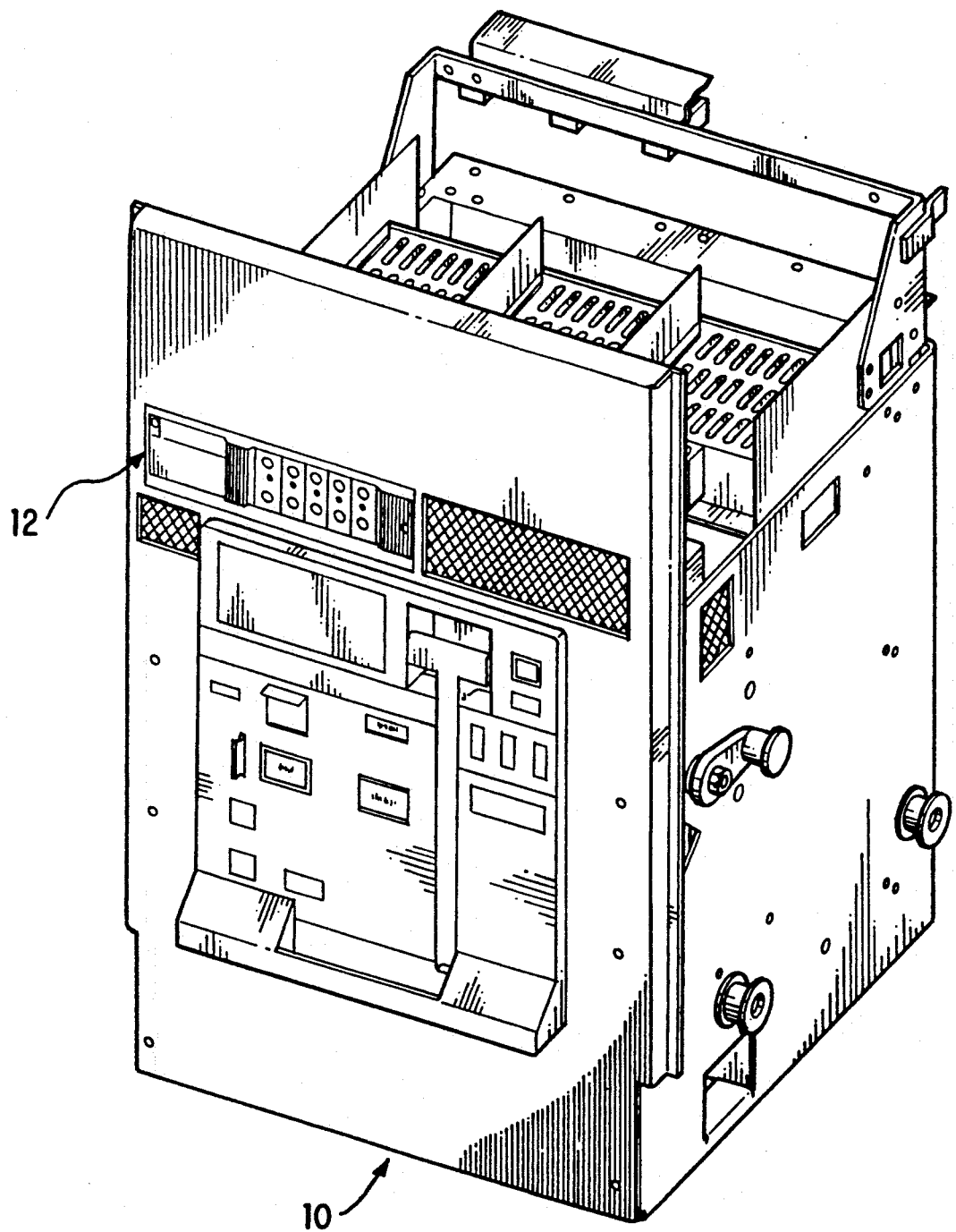
FIG. 1 illustrates the panel, designed according to the teachings of the present invention, incorporated into a circuit breaker.

With reference to the drawings, a panel 12, constructed in accordance with the teachings of the present invention, is shown primarily in FIGS. 1-5 and may be of a zinc casting. In FIG. 1, panel 12 is shown incorporated into circuit breaker 10. Circuit breaker 10 is of the type that is well known in the prior art having separable contacts, an operating mechanism, and an electronic trip unit.

Figure 2:
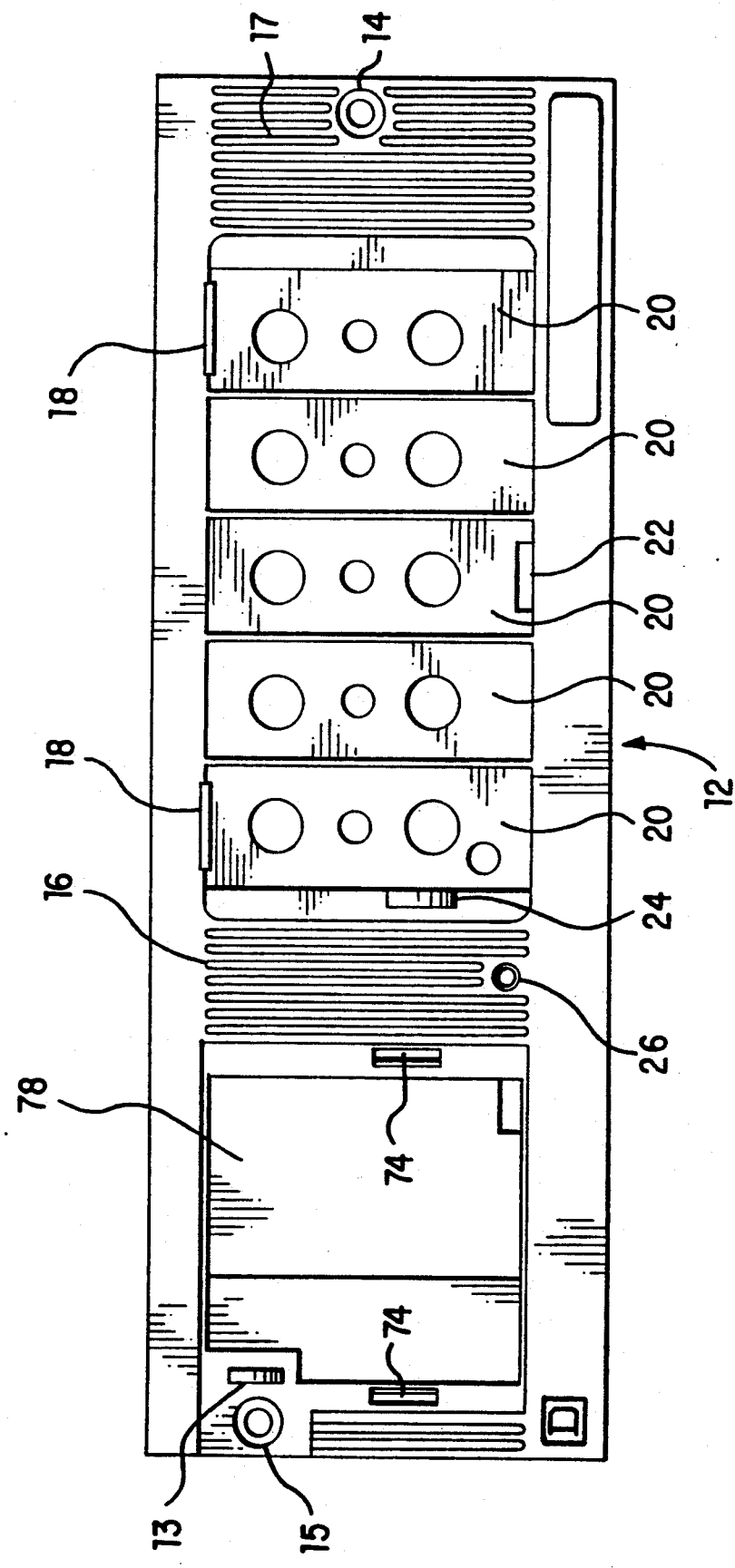
FIG. 2 illustrates the front view of the panel.
Figure 3:
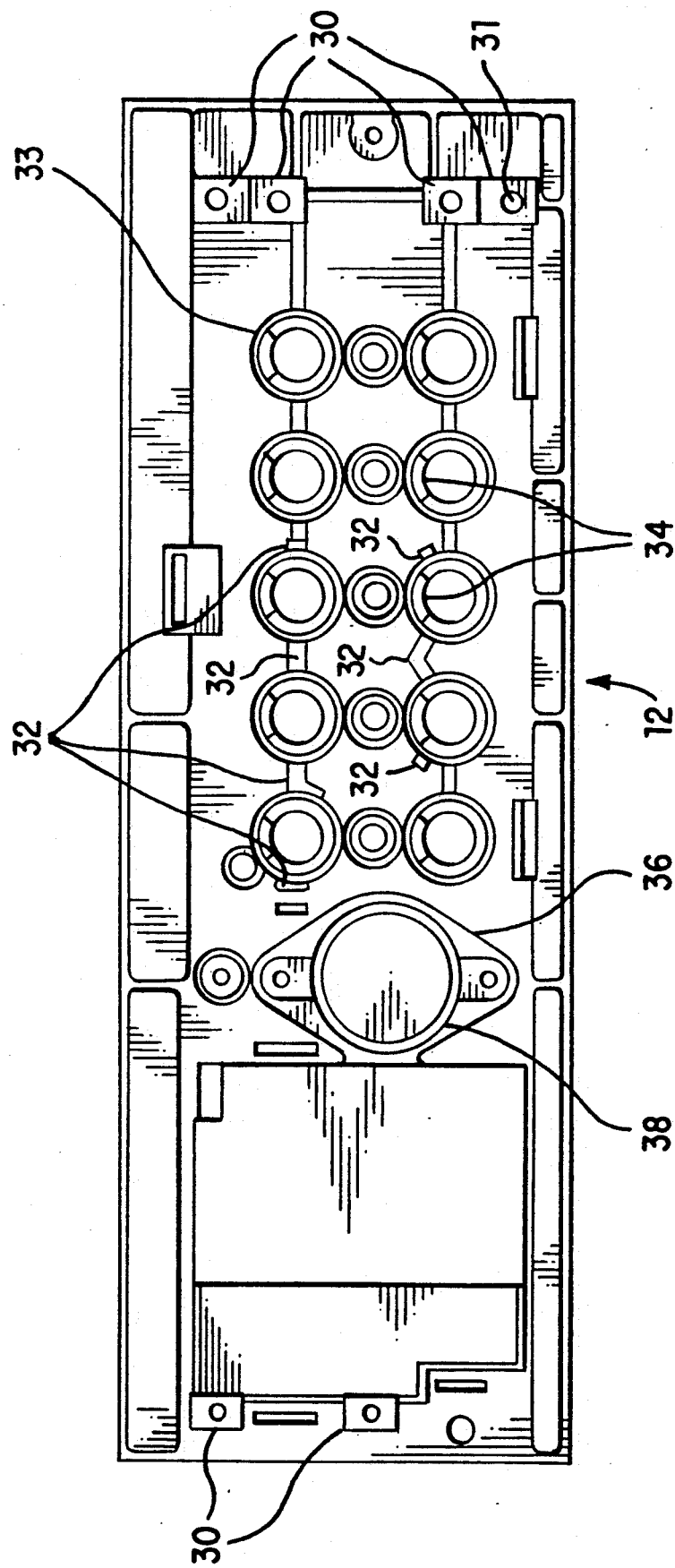
FIG. 3 illustrates the rear view of FIG. 2.
Figure 4:
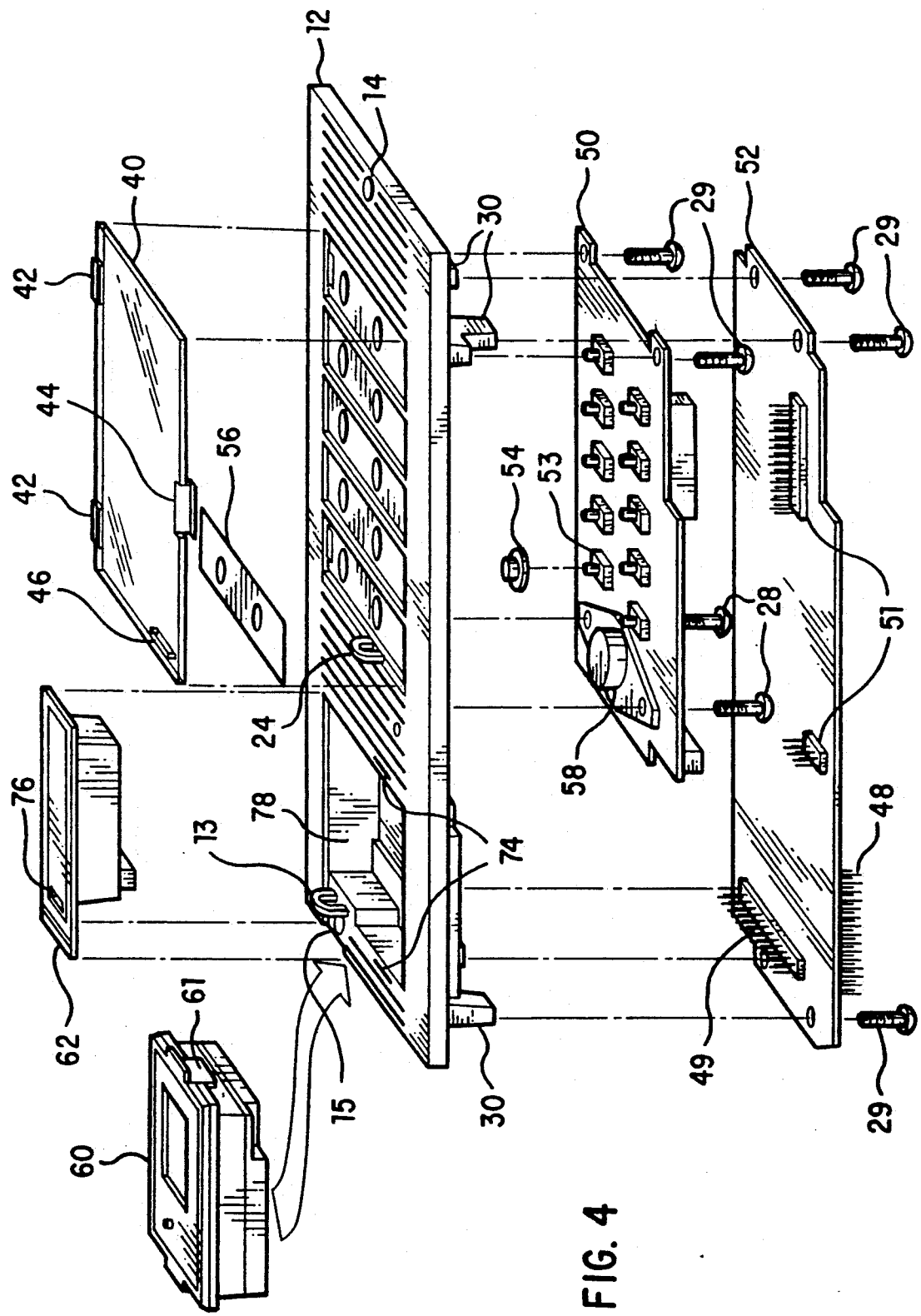
FIG. 4 illustrates an exploded view of the panel designed according to the teachings of the present invention.

Referring to FIGS. 2-4, panel 12 is shown having a large thermal mass 36 formed integrally therewith. Transistor contact surface 38 is formed inside the large thermal mass 36. Transistor contact surface 38 was designed to allow for maximum contact surface between a TO-3 power transistor 58 and the panel 12 to provide cooling from the top surface of the transistor package. Thermal mass 36 was designed to be as large as possible to absorb heat while also being manufacturable.

A plurality of heat dissipation ribs 16, 17 are formed integrally with panel 12 to provide additional cooling for the electronic components. A group of heat dissipation ribs 16 are located directly above the power transistor 58 to maintain safe operating temperature during moderate to high power surges.

Standoffs 30 are formed integrally with panel 12. Standoffs 30 having apertures 31 suitably sized for self-tapping screws 28 & 29 therein. The printed circuit boards 50 & 52 (FIG. 4) mount directly to the standoffs 30, allowing for positive alignment with the switches 53, switch knobs 54, power transistor 58, accessory connector 49, inter-board connectors 51, external connectors 48 (FIG. 5) and the fiber optic cable access hole 26.

The panel 12 has a plurality of switch apertures 33 therethrough for adjusting switches. The under surface of panel 12 has raised concentric rings surrounding the switch apertures 33. The raised concentric rings have inner switch stops 34 therein and raised outer switch stops 32 therebeside, for preventing invalid switch settings. Switch stops 32, 34 cooperate with knobs 54 (FIG. 4) that are installed on the switches 53 (FIG. 4). Depending on the desired product, different knobs 54 are used to interact with either the outer switch stops 32 or the inner switch stops 34, thus allowing the same panel 12 to be used with multiple products. Sealable mounting holes 14 & 15 are provided for attaching panel 12 to other devices, such as circuit breaker 10.

On the top surface of panel 12 there is provided switch recessed label areas 20 for applying suitably sized labels 56 (FIG. 5) to be applied thereon. The recessed area assist in proper alignment of the labels.

Fiber optic access aperture 26 allows for easy initial insertion of a standard 1000 micron plastic fiber optic cable, and has a gradual taper that will cause an interference fit therewith and retain the cable. The location of the opening can be held in tight tolerance with the underlying light source because the printed circuit board that contains the light source is mounted directly to panel 12, thus only a few tolerances can add up. Panel 12 uses a textured black paint as a surface coating which provides much better heat dissipation than the natural material finish or black chromated finishes.

Referring now to both FIG. 2 and FIG. 4, a switch cover 40 is shown having a seal opening 46 therein and retention tabs 42 thereon. A clear plastic material may be used for the switch cover 40. After the switches have been adjusted properly, switch cover 40 is snapped into place by inserting retention tabs 42 into retention slots 18 and pressing down until the cover snap 44 "snaps" into snap hole 22. Sealing post 24 will pass through seal opening 46. Placing a locking device, such as a padlock, through a hole in the sealing post 24 will prevent unauthorized removal of switch, thus prevent tampering with the electronic adjustments.

Now referring to FIG. 4, panel 12 is shown with labels 56 being positioned between switch cover 40 and panel 12. Inter-board connectors 51 connect the switch electronic circuit board 50 to main electronic circuit board 52 and provides electrical communications therebetween. Switches 53 are located on the switch electronic circuit board 50 and have knobs 54 attached thereon.

The rating plug 62 fits into accessory cavity 78 connecting to accessory connector 49 and covering sealable mounting hole 15 so that panel 12 can not be removed after the rating plug 62 is installed. Rating plug slot 76 allows the rating plug sealing post 13 to pass therethrough. Unauthorized removal of the rating plug 62 can be prevented by installing a locking device through a hole in the rating plug sealing post 13.

The LCD trip indicator 60 is then placed into the accessory cavity 78 next to the rating plug 62. Proper alignment with the accessory connector 49 is assured by placing alignment tabs 61, located on the trip indicator 60, into alignment slots 74. After the LCD trip indicator 60 is installed removal of the rating plug 62 is prohibited.

The panel 12 is required to be electrically grounded to the PC board ground. Utilizing the proper transistor this can be accomplished. The power transistor 58 is mounted to the switch electronic circuit board 50 with rivets. Self tapping screws 28 are installed from the back of the switch electronic circuit board 50, through the power transistor 58 and into the panel 12. When the screw is tightened a star washer between the transistor and the top side of the electronic circuit board digs into the electronic circuit board ground plane. The screw head is forced onto a ground pad on the back side of the switch electronic circuit board 50. Thus the panel is electrically connected to the electrical ground via the transistor mounting screws 28. The ground path is conducted from switch electronic circuit board 50 to main electronic circuit board 52 through inter-board connectors 51. The ground path is then conducted to the interconnect board through external connector 48. External connections to ground can be made through circuit breaker terminal strip 72. Connecting the panel to electrical ground provides a method for connecting the panel to safety ground. The zone restraint interlock common, on the circuit breaker terminal strip 72, is connected to electrical ground in the electronic circuit board and thusly the panel is also connected to ground.

Figure 5:
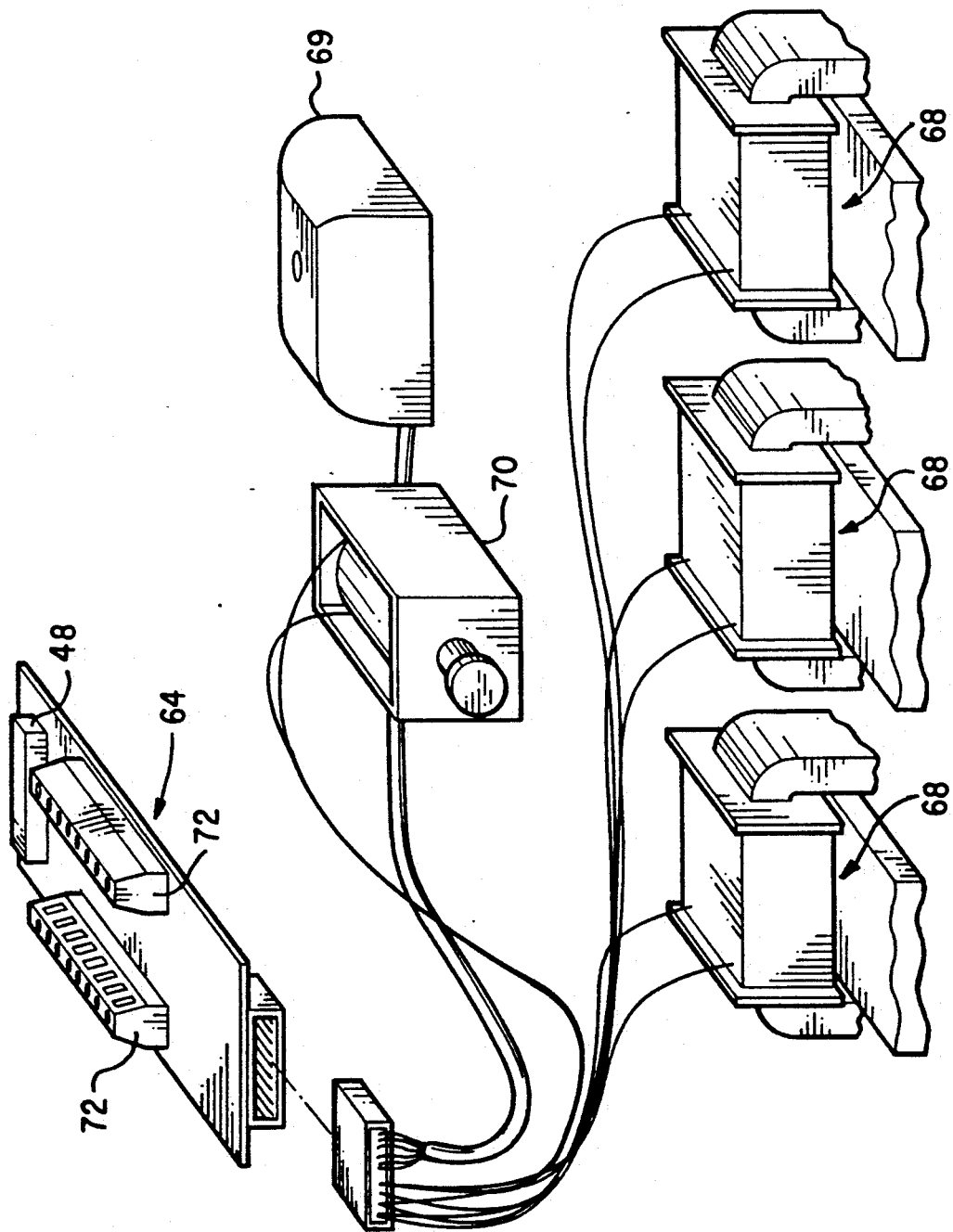
FIG. 5 illustrates the components that are mounted within the circuit breaker.

FIG. 5 shows the components that are mounted within the circuit breaker. Current transformers 68, a trip solenoid 70 and a ground fault toroid 69 are connected to the interconnect board 64.

While there have been shown and described what are at present considered the preferred embodiments of the invention, it will be obvious to those skilled in the art that various changes and modifications may be made therein without departing from the scope of the invention as defined by the appended claims.

What is claimed is:

1. A panel for mounting a printed circuit board comprising:
   mounting means integrally formed to said panel for mounting a printed circuit board thereto;
   a large thermal mass of material, integral to said panel and adapted to be in direct contact with and provide cooling for a transistor being electrically coupled to the printed circuit board, wherein said large thermal mass of material is adapted for encompassing the top part of the transistor by having a cavity formed therein;
   switch stop means for preventing invalid switch settings integrally formed on said panel and encircling a switch aperture in said panel, wherein said switch aperture allows physical access to an electronic adjustment switch that is electrically coupled to the printed circuit board;
   a cover securely attachable over said switch aperture having an aperture therein; and
   a locking post protruding through said aperture in said cover, said post formed integrally with said panel and having an open portion therein for enabling locking means passage therethrough.

2. The panel according to claim 1 further comprises a plurality of heat dissipating ribs integrally formed thereon.

3. The panel according to claim 1 further includes a textured paint surface thereon.

4. The panel according to claim 1 wherein said panel is comprised of zinc.

5. The pane according to claim 1 wherein said mounting means comprises:
   a plurality of stand off posts integral with said panel, said posts having apertures therein for receiving self-tapping screws.

6. The panel according to claim 1 further including a fiber optic aperture having a substantially gradual taper therein that will produce an interference fit for securely retaining a fiber optic cable.

7. The panel according to claim 1 further includes indented areas for placement of labels therein, said indented areas allow the labels to be aligned properly onto said panel.

8. A panel for mounting a circuit interrupter electronic trip unit comprising:
   cooling means for cooling electronic components, said cooling means having heat dissipating ribs integrally formed to said panel;
   said panel having at least one switch aperture, wherein said switch aperture allows access to an electronic adjustment switch that is electrically coupled to the circuit interrupter electronic trip unit;
   stop means integrally formed on said panel for preventing the electronic adjustment switch from being adjusted to an invalid switch setting; and
   tamper resistant sealing means for sealing the electronic adjustment switch, said tamper resistant sealing means prevents tampering with the electronic adjustment switch.

9. The panel according to claim 8 wherein said cooling means further includes a large thermal mass of material integrally formed to said panel.

10. The panel according to claim 9 wherein said large thermal mass of material further comprises a cavity integrally formed in said large thermal mass of material and being adapted for receiving a power transistor therein, wherein the power transistor is electrically coupled to the circuit interrupter electronic trip unit.

11. The panel according to claim 8 wherein said panel further includes textured paint as a surface coating thereon.

12. The panel according to claim 8 further comprises posts extending therefrom and integrally formed thereon, wherein said posts being adapted for supporting the circuit interrupter electronic trip unit.

13. The panel according to claim wherein said posts contain apertures therein for receiving self-tapping screws, whereby the self-tapping screws can secure the circuit interrupter electronic trip unit to said posts.

14. The panel according to claim 8 wherein said tamper resistant sealing means comprising:
a cover adapted to be securely attachable over the electronic adjustment switch; and
a post protruding through said cover, said post formed integrally with said panel and having an open portion therein for enabling locking means to pass therethrough.

15. The panel according to claim 8 wherein said stop means comprises concentric stop rings integrally formed on said panel with raised and lowered surfaces thereon that cooperate with a knob that is engagingly fixed on the electronic adjustment switch, said concentric stop rings surround said switch aperture.

16. The panel according to claim 8 further comprises an aperture therein having a gradual taper that will produce an interference fit and securely retain a fiber optic cable.

17. The panel according to claim 8 further comprises recessed areas therein to allow labels to be aligned properly onto said panel.

18. A circuit interrupter comprising:
separable contacts;
an operating mechanism for opening and closing said separable contacts;
an electronic trip unit for the control of said operating mechanism to initiate opening of said separable contacts upon occurrence of an overcurrent condition passing through said separable contacts;
a panel for mounting said electronic trip unit said circuit interrupter;
said panel is comprised of a zinc casting that provides a means for cooling electronic trip unit components,
a large thermal mass of material; and
a cavity integrally formed in said large thermal mass of material adapted for receiving a power transistor therein, said cavity being adapted to encompass the top portion of the power transistor so that said top portion of the power transistor is in direct contact with said large thermal mass.

19. The circuit interrupter according to claim 18 wherein said panel further includes a plurality of heat dissipation ribs formed integrally thereon.

20. The circuit interrupter according to claim 18 wherein said cooling means further includes a layer of textured paint as a surface coating on said panel.

21. The circuit interrupter according to claim 18 wherein said panel includes a plurality of standoffs integrally formed therewith having holes suitably sized for receiving self-tapping screws.

22. The circuit interrupter according to claim 18 wherein said panel includes apertures, electronic adjustment switches and means for sealing and resisting tampering with electronic adjustments, said tamper resistant means comprising:
a cover securely attachable over said electronic adjustment switches; and
a post protruding through said cover, said post formed integrally with said panel and having an open portion therein enabling a locking means to pass therethrough.

23. The circuit interrupter according to claim 22 wherein said panel further includes stop means for preventing invalid switch settings, said stop means comprises concentric stop rings with raised and lowered surfaces thereon that cooperate with knobs that are engagingly fixed to said electronic adjustment switches.

24. The circuit interrupter according to claim 18 further including a fiber optic port having means therein for securely retaining a fiber optic cable, said retaining means comprises a gradual taper that will produce an interference fit for retain the fiber optic cable.

25. The circuit interrupter according to claim 18 wherein said panel includes areas indented to allow labels to be aligned properly onto said panel.

* * * * *